(12) United States Patent
Henry et al.

(10) Patent No.: US 6,465,297 B1
(45) Date of Patent: Oct. 15, 2002

(54) METHOD OF MANUFACTURING A SEMICONDUCTOR COMPONENT HAVING A CAPACITOR

(75) Inventors: Haldane S. Henry, Glendale, AZ (US); Darrell G. Hill, Tempe, AZ (US); Jonathan K. Abrokwah, Chandler, AZ (US); Mariam G. Sadaka, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 154 days.

(21) Appl. No.: 09/679,861

(22) Filed: Oct. 5, 2000

(51) Int. Cl.[7] .......................................... H01L 21/8242
(52) U.S. Cl. ........................ 438/238; 438/240; 438/3; 438/253
(58) Field of Search ..................... 438/3, 240, 250–256, 438/238, 381, 393–399

(56) References Cited

U.S. PATENT DOCUMENTS

| | | | |
|---|---|---|---|
| 5,525,542 A | 6/1996 | Maniar et al. | 437/186 |
| 5,578,523 A | 11/1996 | Fiordalice et al. | 437/190 |
| 5,652,176 A | 7/1997 | Maniar et al. | 437/67 |
| 5,674,771 A * | 10/1997 | Machida et al. | 438/396 |
| 5,734,177 A * | 3/1998 | Sakamoto | 438/240 |
| 5,812,364 A | 9/1998 | Oku et al. | 361/312 |
| 6,255,187 B1 * | 7/2001 | Horii | 438/253 |
| 6,329,234 B1 * | 12/2001 | Ma et al. | 257/301 |

* cited by examiner

Primary Examiner—Jey Tsai
(74) Attorney, Agent, or Firm—Charles W. Bethards; Kim-Marie Vo

(57) ABSTRACT

A method of manufacturing a semiconductor component includes forming a first capacitor electrode (126) over a substrate (110), forming a capacitor dielectric layer (226) over the first capacitor electrode, and forming a second capacitor electrode (326) over the capacitor dielectric layer. The capacitor dielectric layer is made of aluminum.

21 Claims, 5 Drawing Sheets

```
┌─────────────────────────────────────────────────────────────────┐
│ FORMING A FIRST DIELECTRIC LAYER LOCATED OVER THE FIRST CAPACITOR│─ 731
│      ELECTRODE AND SUBSTANTIALLY DEVOID OF ALUMINUM             │
└─────────────────────────────────────────────────────────────────┘
                                  ▼
┌─────────────────────────────────────────────────────────────────┐
│ FORMING A SECOND DIELECTRIC LAYER LOCATED OVER THE FIRST DIELECTRIC│─ 732
│            LAYER AND COMPRISED OF ALUMINUM                      │
└─────────────────────────────────────────────────────────────────┘
                                  ▼
┌─────────────────────────────────────────────────────────────────┐
│ FORMING A THIRS DIELECTRIC LAYER LOCATED OVER THE SECOND DIELECTRIC│─ 733
│            LAYER SUBSTANTIALLY DEVOID OF ALUMINIM               │
└─────────────────────────────────────────────────────────────────┘
```

```
┌─────────────────────────────────────────────────────────────────┐
│ FORMING A THIRD METAL LAYER LOCATED OVER THE CAPACITOR DIELECTRIC LAYER │─ 841
└─────────────────────────────────────────────────────────────────┘
                                  ▼
┌─────────────────────────────────────────────────────────────────┐
│    FORMING A FOURTH METAL LAYER LOCATED OVER THE THIRD METAL LAYER    │─ 842
└─────────────────────────────────────────────────────────────────┘
                                  ▼
┌─────────────────────────────────────────────────────────────────┐
│      PATTERNING THE THIRD AND FOURTH METAL LAYERS AND THE       │─ 843
│                   FOURTH DIELECTRIC LAYER                       │
└─────────────────────────────────────────────────────────────────┘
```

METHOD OF MANUFACTURING A SEMICONDUCTOR COMPONENT HAVING A CAPACITOR

FIELD OF THE INVENTION

This invention relates to electronics, in general, and more particularly to methods of manufacturing semiconductor components and semiconductor components thereof.

BACKGROUND OF THE INVENTION

High frequency, high current capacitors are often combined or integrated with other circuitry on a single semiconductor chip. These integrated high frequency, high current capacitors are needed for applications in digital cellular telephones, cellular telephone base stations, and radio frequency power amplifiers. These capacitors in the integrated circuit are made of a capacitor dielectric layer located between top and bottom capacitor electrodes.

A first or bottom layer of interconnect in the integrated circuit is commonly referred to as a "metal 1" layer. A portion of the metal 1 layer is commonly used as the bottom capacitor electrode. The top electrode for the integrated capacitor, however, is not formed from the next interconnect layer, or the "metal 2" layer. Instead, a separate metal layer is formed to provide the top capacitor electrode. This additional metal layer increases the cost and complexity of the manufacturing process for the integrated circuit. The bottom capacitor electrode can be made of aluminum, copper, gold, or the like, and the top capacitor electrode can be made of aluminum, copper, gold, or the like.

A dielectric layer is formed between the metal 1 and metal 2 layers. This interlayer dielectric, however, is not used as the capacitor dielectric layer. Instead, at least one separate dielectric layer is formed to provide the capacitor dielectric layer. The additional dielectric layer further increases the cost and complexity of the manufacturing process. The capacitor dielectric layer can be made of silicon nitride or an oxide such as silicon dioxide, Tetra-Ethyl-Ortho-Silicate (TEOS), or tantalum oxide. The capacitor dielectric layer can also be made of a combination of a silicon nitride layer and one or more oxide layers.

An example of a specific process used to form the top capacitor electrode includes using a photoresist lift-off process to define the top capacitor electrode. This lift-off process suffers from the problem of the top capacitor electrode having a limited thickness. The thickness of the top capacitor electrode must be increased to make the integrated capacitor compatible with high current applications. Accordingly, a plating process is often added to increase the thickness of the top capacitor electrode. The plating process requires the use of an additional photoresist mask. Therefore, this top capacitor electrode formation process requires the use of two photoresist masks: one for the plating process and one for the lift-off process. These two additional photoresist masks increase the cost and complexity of the manufacturing process.

An example of a second process used to form the top capacitor electrode includes using a via etch process where the integrated capacitor is formed within a via. The via is formed or etched into a thick dielectric layer located over the bottom capacitor electrode. The etching process for the via is time-consuming and complicated because of the large thickness of the dielectric layer. A first photoresist mask is required to define the via in the thick dielectric layer. Next, the capacitor dielectric layer is formed in the via, and then the top capacitor electrode is formed using a plating process. A second photoresist mask is required to define the plated top capacitor electrode. Therefore, this top capacitor electrode formation process also requires two additional photoresist masks, which increase the cost and complexity of the manufacturing process. An additional problem of this top capacitor electrode formation process includes undesired electrical shorting between the top and bottom capacitor electrodes. This electrical shorting occurs within the via due to poor step coverage of the capacitor dielectric layer within the via.

Accordingly, a need exists for a method of manufacturing a semiconductor component and semiconductor component thereof where the semiconductor component has a high frequency, high current capacitor combined with additional circuitry on a single semiconductor chip. The addition of the integrated capacitor should not significantly increase the cost or complexity of the manufacturing process of the integrated circuit.

BRIEF DESCRIPTION OF THE DRAWINGS

The invention will be better understood from a reading of the following detailed description, taken in conjunction with the accompanying drawing figures in which:

FIGS. 6, 7, and 8 illustrate flow charts of detailed portions of the method of FIG. 5.

Figure 1:
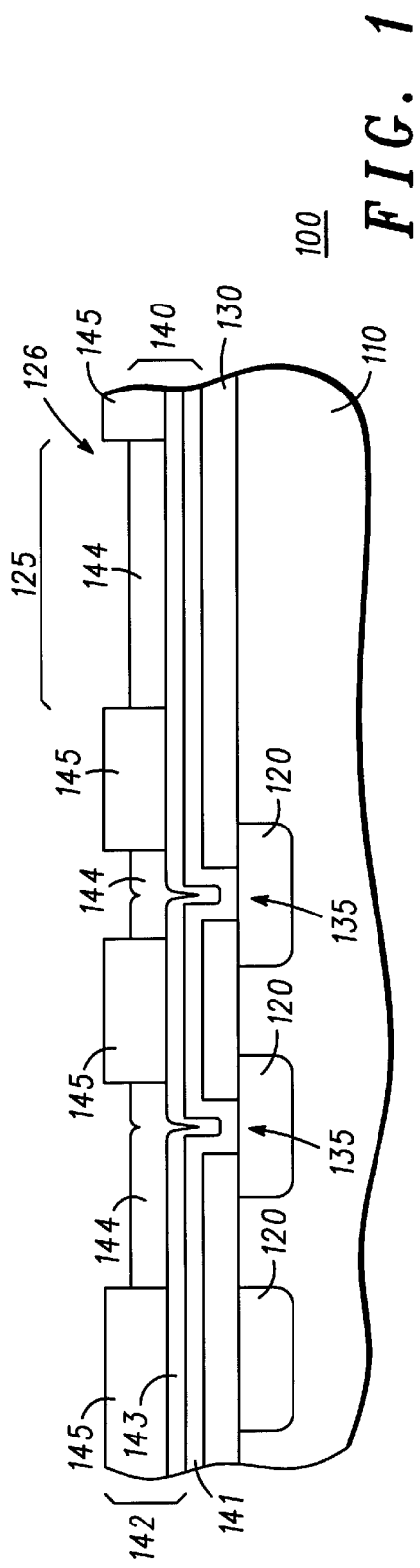
FIG. 1 illustrates a cross-sectional view of a portion of a semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in sequences other than described or illustrated herein.

Moreover, the terms front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in orientations other than described or illustrated herein.

DETAILED DESCRIPTION OF THE DRAWINGS

FIG. 1 illustrates a cross-sectional view of a portion of a semiconductor component. In the preferred embodiment, the semiconductor component includes a high current, high frequency Metal-Insulator-Metal (MIM) capacitor that is compatible with being integrated on a single semiconductor chip with other high current, high frequency semiconductor devices. As explained in more detail hereinafter, the semiconductor component includes a substrate, a first capacitor electrode located over the substrate, a capacitor dielectric layer located over the first capacitor electrode and comprised of aluminum, and a second capacitor electrode located over the capacitor dielectric layer. The method of manufacturing the capacitor is compatible with manufacturing processes for other high current, high frequency semiconductor devices such as, for example, Heterojunction Bipolar Transistors (HBTs). Portions of first and second interconnect layers in the semiconductor component serve as the bottom and top capacitor electrodes, respectively, in the integrated capacitor. A portion of the interlayer dielectric located between the first and second interconnect layers serves as the capacitor dielectric layer in the integrated capacitor.

In FIG. 1, a semiconductor component 100 is illustrated to include a substrate 110. Substrate 110 is comprised of a semiconductor material. Examples of suitable semiconductor materials include, for example, silicon, indium phosphide, silicon carbide, silicon germanium, and the like. In the preferred embodiment, however, substrate 110 is comprised of gallium arsenide. Substrate 110 can also include epitaxial semiconductor layers, polycrystalline semiconductor layers, dielectric layers, and the like. Examples of suitable dielectric layers include, but are not limited to, silicon dioxide, silicon nitride, TEOS, and aluminum nitride.

A plurality of semiconductor devices 120 are formed at least partially within substrate 110. Devices 120 are supported by substrate 110. Devices 120 can have many different well-known structures and physical embodiments. As an example, devices 120 can include bipolar transistors, Metal-Oxide-Semiconductor Field Effect Transistors (MOSFETs), Junction Field Effect Transistors (J-FETs), or the like. Therefore, the depicted structures of devices 120 in FIG. 1 are merely for the purpose of identifying the locations of devices 120 relative to the other structures within component 100. Commonly known features such as, for example, electrical isolation tubs are not illustrated in substrate 110 in FIG. 1.

Next, a dielectric layer 130 is deposited over substrate 110 and devices 120. Layer 130 electrically isolates portions of devices 120 and substrate 110 from an interconnect layer subsequently formed over layer 130. Layer 130 includes at least one layer of a dielectric material such as, for example, silicon nitride, silicon dioxide, TEOS, aluminum nitride, or the like. Layer 130 can also include a combination of layers of such dielectric materials. Suitable techniques for depositing layer 130 are well-known in the art.

After being deposited, layer 130 is patterned to form vias 135 within layer 130. Suitable etchants used to form vias 135 are well-known in the art. An interconnect layer is subsequently formed within vias 135 and over dielectric layer 130 to electrically couple devices 120 to each other and to external components.

Next, a composite interconnect layer 140 is formed over layer 130, devices 120, and substrate 110 and within vias 135. A portion of interconnect layer 140 is used to form a bottom capacitor electrode 126 for an integrated capacitor 125 within component 100. Other portions of interconnect layer 140 are used to electrically couple together semiconductor devices 120. Interconnect layer 140 is comprised of electrically conductive layers 141 and 142, and electrically conductive layer 142 is comprised of electrically conductive sub-layers 143 and 144.

First, electrically conductive layer 141 is deposited over dielectric layer 130 and within vias 135. In the preferred embodiment, layer 141 is deposited using a sputtering process to a thickness of approximately 100 to 200 nanometers. Layer 141 can alternatively be deposited using, for example, an evaporation process. Also in the preferred embodiment, layer 141 is comprised of a diffusion barrier material such as titanium. Layer 141 can alternatively be comprised of other diffusion barrier materials such as, for example, tungsten, titanium tungsten, or the like. Further in the preferred embodiment, layer 141 is deposited directly on dielectric layer 130.

Next, electrically conductive layer 142 is deposited over electrically conductive layer 141. Layer 142 is comprised of an electrically conductive material having a resistivity lower than a resistivity of the barrier material of layer 141. In the preferred embodiment, layer 142 is comprised of gold. In other embodiments, layer 142 can be comprised of other low resistivity electrically conductive materials such as, for example, aluminum and/or copper. Gold, however, has a lower resistivity than aluminum, copper, or aluminum copper, and is more suitable for high current applications and high frequency applications. Also in the preferred embodiment, the gold of electrically conductive layer 142 is formed directly on electrically conductive layer 141.

In the preferred embodiment, layer 142 is deposited by first sputter depositing electrically conductive sub-layer 143 to a thickness of approximately 100 to 200 nanometers. Sub-layer 143 serves as a seed layer for plating electrically conductive sub-layer 144 of electrically conductive layer 142. After sputter depositing sub-layer 143, a photoresist mask 145 is formed over sub-layer 143. Mask 145 exposes portions of sub-layer 143 to define plating areas. Sub-layer 144 is plated within these portions, preferably to a thickness of approximately 1 to 2 micrometers.

In an alternative embodiment, electrically conductive layer 142 can be deposited in a single step using techniques such as evaporation or sputtering. The preferred plating process, however, can more easily form layer 142 to a large thickness suitable for high current applications.

Next, electrically conductive layers 142 and 141 are patterned sequentially. First, photoresist mask 145 is removed or stripped to expose portions of sub-layer 143 of layer 142. Next, the exposed portions of sub-layer 143 are de-plated to expose portions of electrically conductive layer 141. Next, the exposed portions of layer 141 are removed or etched, preferably using a dry etchant comprised of methyl trifluoride ($CHF_3$) and sulfur hexafluoride ($SF_6$).

Figure 2:
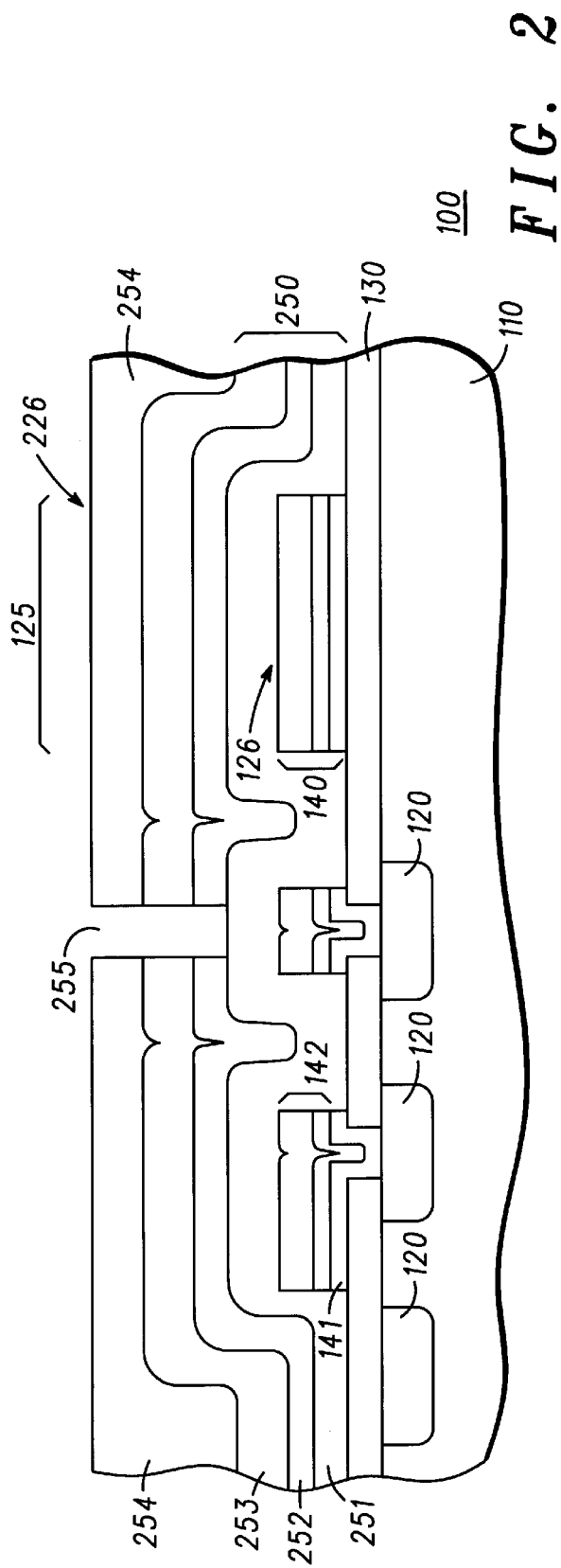
FIG. 2 illustrates a cross-sectional view of the portion of the semiconductor component after subsequent manufacturing steps in accordance with an embodiment of the invention.

FIG. 2 illustrates a cross-sectional view of the portion of component 100 after patterning electrically conductive layers 142 and 141 and also after additional processing steps in a manufacturing process. An interlayer dielectric or composite dielectric layer 250 is formed over interconnect layer 140, dielectric layer 130, devices 120, and substrate 110. A portion of layer 250 is used to form a capacitor dielectric layer 226 for integrated capacitor 125. Layer 250 preferably comprises aluminum and an amorphous structure, and layer 250 includes dielectric layers 251, 252, and 253.

First, a dielectric layer 251 of composite dielectric layer 250 is formed over interconnect layer 140 and dielectric layer 130. In the preferred embodiment, layer 251 is comprised of a dielectric material, has a high density, and is substantially devoid of aluminum As an example, layer 251 can be comprised of silicon nitride. Layer 251 can also be comprised of silicon dioxide, TEOS, or the like, but these materials have lower dielectric constants than silicon nitride. The lower dielectric constants decrease the capacitance value per unit area of capacitor 125.

In the preferred embodiment, layer 251 is deposited using a Plasma-Enhanced Chemical Vapor Deposition (PECVD) process to a thickness of approximately 30 to 50 nanometers. The PECVD process preferably deposits layer 251 to have a refractive index of approximately 1.98 to 2.02. Other processes can alternatively be used to deposit layer 251, but these other processes may deposit layer 251 with a refractive index outside of the preferred range. Furthermore, these other processes may also deposit layer 251 to be less conformal, which may produce step coverage problems. Also in the preferred embodiment, layer 251 is deposited directly on dielectric layer 130 and electrically conductive layer 142 of interconnect layer 140.

After forming dielectric layer 251, the back side of substrate 110 can optionally be etched to remove any gold that may have been plated on the back side of substrate 110 during the plating of sub-layer 144 of electrically conductive layer 142. Layer 251 serves as an etch mask to protect electrical composite interconnect layer 140 over the front side of substrate 110 during this etching process. As an example, a wet etchant comprised of potassium iodide can be used to remove the undesired gold residue at the back side of substrate 110.

Next, a dielectric layer 252 is formed over dielectric layer 251. Layer 252 serves as an etch stop and is preferably comprised of a dielectric material having aluminum. As an example, layer 252 can be comprised of aluminum nitride. In an alternative embodiment, layer 252 can be comprised of aluminum oxide. Other dielectric compositions are also possible for layer 252 depending on the compositions of dielectric layers 251 and 253 and also depending upon the etch chemistry used to etch a subsequently formed electrically conductive layer comprised of a barrier material.

In the preferred embodiment, dielectric layer 252 is deposited using a reactive sputtering process to a thickness of approximately 20 to 40 nanometers. Also in the preferred embodiment, layer 252 is deposited directly on dielectric layer 251. When comprised of aluminum nitride, layer 252 is preferably not deposited to have a crystalline structure because of the difficulty in etching crystalline aluminum nitride. When comprised of aluminum nitride, layer 252 is also preferably deposited to have a low pin hole density. The temperature of the reactive sputtering process does not significantly affect the pin hole density of layer 252. Having these characteristics, the aluminum nitride of layer 252 can be easily etched with a dilute basic solution.

Dielectric layer 251 separates dielectric layer 252 from electrically conductive layer 142. Layer 251 keeps the aluminum of layer 252 away from the gold of layer 142. Aluminum is very corrosive and chemically reacts with gold to create undesirable interactions.

Then, a dielectric layer 253 is formed over dielectric layer 252. Layer 253 is comprised of a dielectric material and is preferably devoid of aluminum. In the preferred embodiment, layer 253 is comprised of the same dielectric material as layer 251. In an alternative embodiment, layer 253 can be comprised of a dielectric material different from layer 251. In the preferred embodiment, layer 253 is formed or deposited using the same technique as explained earlier for layer 251. In an alternative embodiment, layer 253 can be formed or deposited using a different technique. Also in the preferred embodiment, layer 253 has the same thickness as layer 251, but in an alternative embodiment, layer 253 can have a thickness greater than or less than that of layer 251. Further in the preferred embodiment, layer 253 has a refractive index similar to that of layer 251, but in an alternative embodiment, layer 253 can have a refractive index greater than or less than that of layer 251. These similarities between dielectric layers 251 and 253 simplify the manufacturing process for semiconductor component 100.

After the deposition of composite dielectric layer 250, layer 250 is patterned. A photoresist mask 254 is formed over layer 250 to define a via 255 in layer 250. A dry etchant such as, for example, $CHF_3$ or $SF_6$ can be used to etch via 255 into layer 253. Then, a wet etchant comprised of hydrofluoric acid followed by a wet etchant comprised of dilute ammonium hydroxide can be used to etch via 255 into layer 252. Next, the same etchant used to etch via 255 into layer 253 can also be used to etch via 255 into layer 251 to simplify the manufacturing process. After the formation of via 255 in layer 250, the photoresist mask 254 is removed or stripped.

Dielectric layer 253 separates dielectric layer 252 from photoresist mask 254. Layer 253 keeps the aluminum nitride of layer 252 away from a developer used to form photoresist mask 254. The developer etches aluminum nitride. Another reason for the use of dielectric layer 253 is to improve the adhesion of photoresist mask 254 to layer 250. Photoresist does not adhere well to aluminum nitride.

Figure 3:
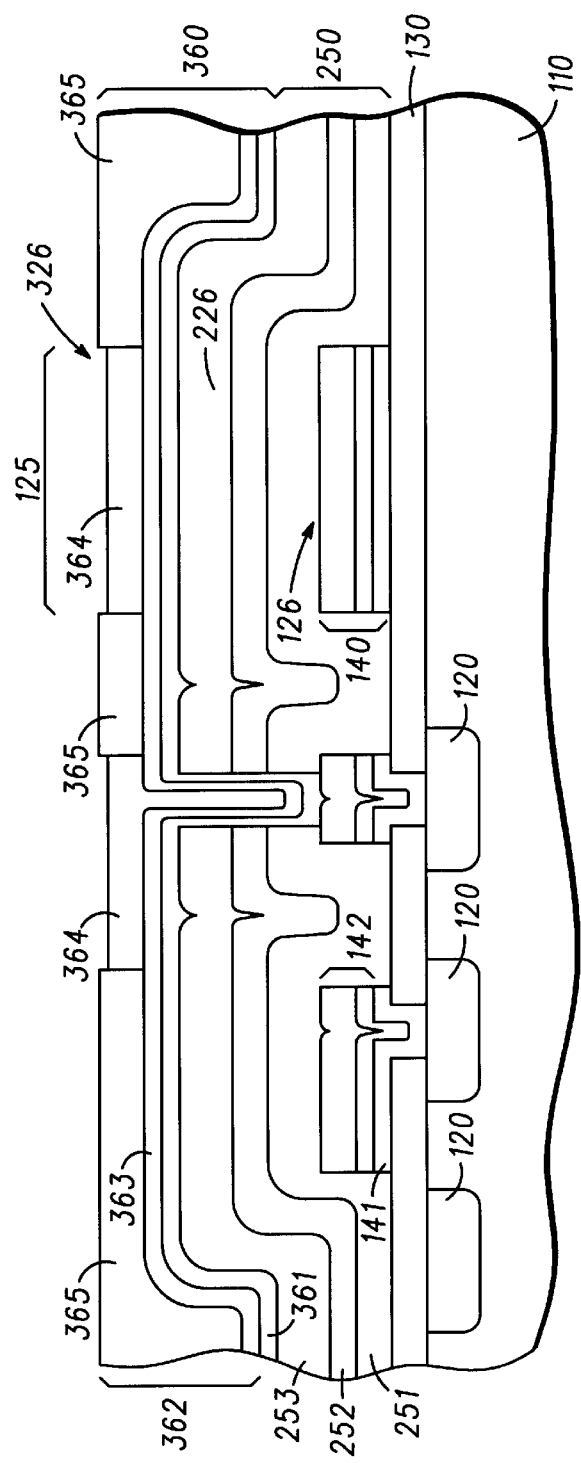
FIG. 3 illustrates a cross-sectional view of the portion of the semiconductor component after additional steps in the manufacturing process in accordance with an embodiment of the invention.

FIG. 3 illustrates a cross-sectional view of the portion of semiconductor component 100 after additional processing steps in the manufacturing process. FIG. 3 illustrates the formation of a composite interconnect layer 360 over composite dielectric layer 250. In the preferred embodiment, composite interconnect layer 360 is deposited directly on composite dielectric layer 250. A portion of interconnect layer 360 is used to form a top capacitor electrode 326 for integrated capacitor 125 in component 100. Other portions of interconnect layer 360 electrically couple semiconductor devices 120 to each other and to external components. Interconnect layer 360 is comprised of electrically conductive layers 361 and 362, and electrically conductive layer 362 is comprised of electrically conductive sub-layers 363 and 364.

The method of forming interconnect layer 360 is preferably similar to the method of forming interconnect layer 140 to simplify the manufacturing process for semiconductor component 100. Accordingly, the composition of interconnect layer 360 is preferably similar to the composition of interconnect layer 140. For example, electrically conductive layer 361 of interconnect layer 360 is preferably comprised of the same sputtered barrier material as that of electrically conductive layer 141 of interconnect layer 140. Similarly, electrically conductive layer 362 of interconnect layer 360 is preferably comprised of the same sputtered and plated electrically conductive sub-layers as that of electrically conductive layer 142 of interconnect layer 140. A photoresist mask 365 is used to define the plated portions of electrically conductive layer 362, namely electrically conductive sub-layer 364. In the preferred embodiment, layer 361 has the same thickness as layer 141, but the thickness of layer 362 is preferably greater than that of layer 142 when interconnect layer 360 is the top interconnect layer and serves as a power bus. As an example, layer 362 can have a thickness of approximately 2 to 3 micrometers.

In the preferred embodiment, electrically conductive layer 361 separates electrically conductive layer 362 and dielectric layer 253. The gold of layer 362 does not adhere well to the silicon nitride of layer 253. Accordingly, in addition to serving as a diffusion barrier, the titanium of layer 361 also serves as an adhesive between layers 362 and 253.

Figure 4:
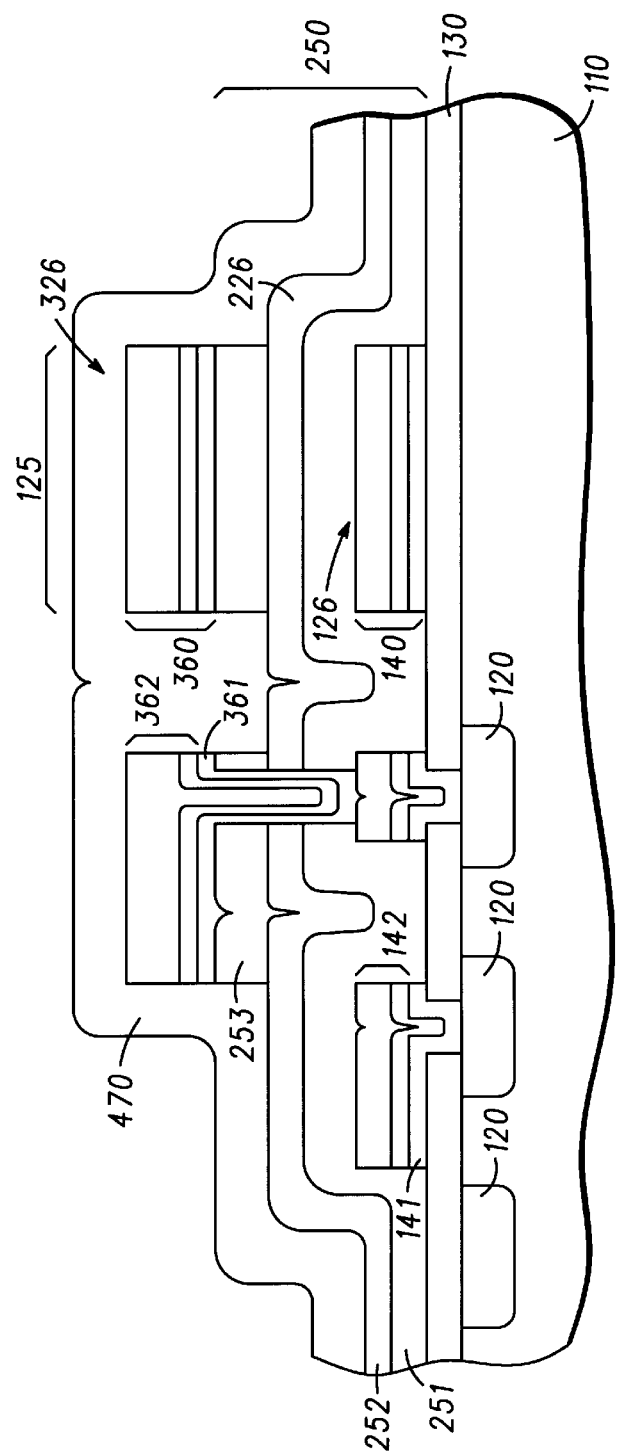
FIG. 4 illustrates a cross-sectional view of the portion of the semiconductor component after further steps in the manufacturing process in accordance with an embodiment of the invention.

After depositing composite interconnect layer 360, layer 360 is patterned (See FIG. 4). The patterning process for layer 360 is preferably similar to the process used to pattern interconnect layer 140. This similarity further simplifies the manufacturing process for semiconductor component 100. Accordingly, photoresist mask 365 is removed; the exposed portions of electrically conductive sub-layer 363 are de-plated; and then the exposed portions of electrically conductive layer 361 are etched.

The etching of electrically conductive layer 361 is preferably extended to ensure that all of the exposed portions of layer 361 are removed to prevent any undesired electrical shorting and to reduce the magnitude of any leakage currents. This extended etching, or over-etching, will etch, pattern, or remove the exposed portions of dielectric layer 253. During the over-etching of layer 361 and the patterning of dielectric layer 253, dielectric layer 252 serves as an etch stop to protect dielectric layer 251 underlying layer 252. Dielectric layer 252 prevents the total removal of the exposed portions of composite dielectric layer 250 and dielectric layer 252 and also protects devices 120 underlying layer 252. The portions of dielectric layer 251 remaining after the over-etching process prevent the exposure of interconnect layer 140 and electrically isolate interconnect layer 140 from a subsequently deposited interconnect layer (not shown in FIG. 3).

FIG. 4 illustrates a cross-sectional view of the portion of component 100 after the over-etching process and also after additional processing steps of the manufacturing process. A dielectric layer 470 is formed over composite interconnect layer 360 and composite dielectric layer 250. In the preferred embodiment, layer 470 is deposited directly on layers 360 and 250. After being deposited, layer 470 is patterned or etched.

Dielectric layer 470 is comprised of a dielectric material. In an embodiment where the interconnect scheme or Multi-Layer Metallization (MLM) system of component 100 contains only two layers, layer 470 serves as a passivation layer. In a different embodiment where the MLM system of component 100 contains more than two layers, layer 470 serves as an interlayer dielectric separating interconnect layer 360 from another interconnect layer (not shown in FIG. 4) subsequently formed over layers 470 and 360.

Figure 5:
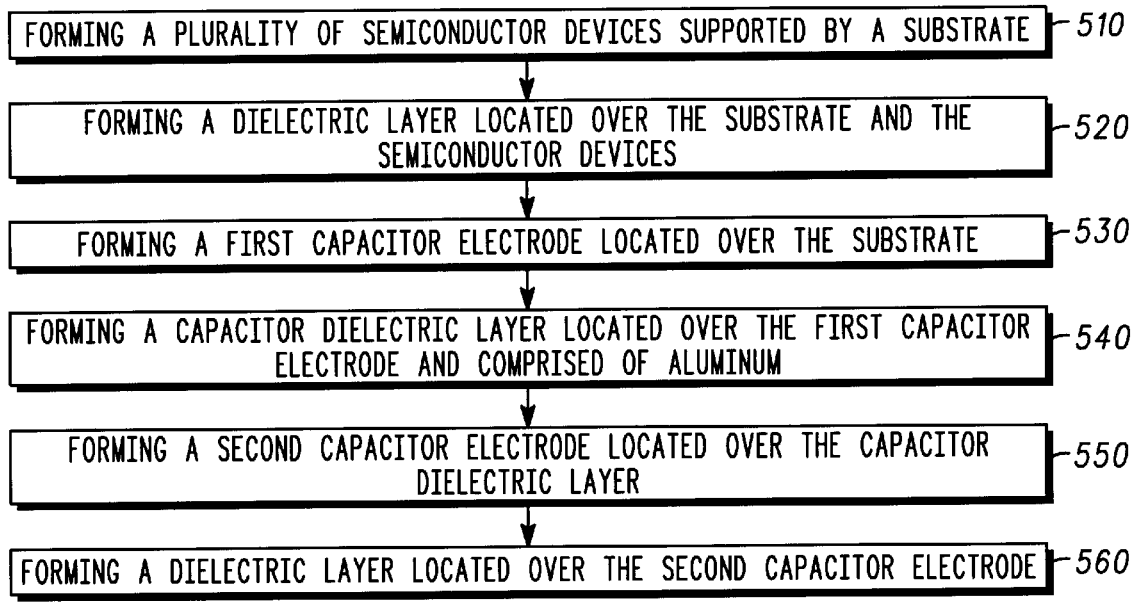
FIG. 5 illustrates a flow chart of a method of manufacturing a semiconductor component in accordance with an embodiment of the invention.

FIG. 5 illustrates a flow chart 500 of a method of manufacturing a semiconductor component, such as component 100 in FIGS. 1 through 4. At a step 510 in flow chart 500, a plurality of semiconductor devices are formed to be supported by a substrate. Then, at a step 520 in flow chart 500, a dielectric layer is formed to be located over the substrate and the semiconductor devices. The dielectric layer can be patterned.

Next, at a step 530 in flow chart 500, a first capacitor electrode is formed to be located over the substrate. Step 530 can simultaneously form a first metal layer in an MLM system Subsequently, at a step 540 in flow chart 500, a capacitor dielectric layer is formed to be located over the first capacitor electrode. The capacitor dielectric layer is comprised of an aluminum compound. Step 540 can simultaneously form an interlayer dielectric between adjacent metal layers in the MLM system The interlayer dielectric can be patterned.

Continuing on in flow chart 500, at a step 550, a second capacitor electrode is formed to be located over the capacitor dielectric layer. Step 550 can simultaneously form a second metal layer in the MLM system Then, at a step 560 in flow chart 500, a dielectric layer is formed to be located over the second capacitor electrode.

Figure 6:
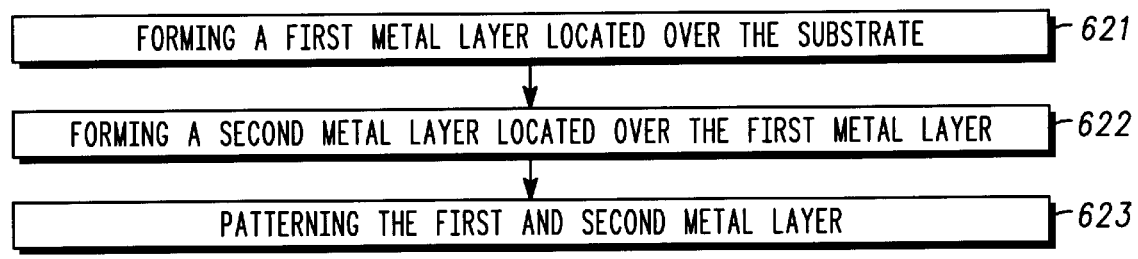

FIGS. 6, 7, and 7 illustrate flow charts of detailed portions of the method of FIG. 5. In FIG. 6, details of step 530 in flow chart 500 of FIG. 5 are explained. At a step 621 in FIG. 6, a first metal layer is formed to be located over the substrate. Then, at a step 622 in FIG. 6, a second metal layer is formed to be located over the first metal layer. Next, at a step 623 in FIG. 6, the first and second metal layers are patterned.

In FIG. 7, details of step 540 in flow chart 500 of FIG. 5 are explained. At a step 731 in FIG. 7, a first dielectric layer is formed to be located over the first capacitor electrode. The first dielectric layer is substantially devoid of aluminum Then, at a step 732 in FIG. 7, a second dielectric layer is formed to be located over the first dielectric layer. The second dielectric layer is comprised of aluminum Next, at a step 733 in FIG. 7, a third dielectric layer is formed to be located over the third dielectric layer. The third dielectric layer is substantially devoid of aluminum In FIG. 8, details of step 550 in flow chart 500 of FIG. 5 are explained. At a step 851 in FIG. 8, a third metal layer is formed to be located over the capacitor dielectric layer. Then, at a step 852 in FIG. 8, a fourth metal layer is formed to be located over the third metal layer. Next, at a step 853 in FIG. 8, the third and fourth metal layers are patterned. During step 853, the fourth dielectric layer in the capacitor dielectric layer is also patterned, and the third dielectric layer in the capacitor dielectric layer serves as an etch stop to protect the underlying second dielectric layer of the capacitor dielectric layer.

Semiconductor components have been manufactured using the method explained in FIGS. 1 through 8. The high current, high frequency capacitors in the semiconductor components do not exhibit any significant amounts of dispersion, degradation in breakdown voltage, or leakage current compared to capacitors manufactured using other manufacturing methods. At an operating frequency of approximately 1 MegaHertz, the capacitors manufactured using the method described herein can have an average capacitance of approximately 600 to 700 picoFarads per millimeter squared. The capacitors manufactured using the method described herein can also have low leakage currents, averaging approximately $3 \times 10^{-10}$ to $4 \times 10^{-10}$ amperes per millimeter squared at a bias voltage of approximately 12 volts and averaging approximately $1 \times 10^{-8}$ to $2 \times 10^{-8}$ amperes per millimeter squared at a bias voltage of approximately 26 volts.

Therefore, an improved method of manufacturing a semiconductor component and component thereof is provided to overcome the disadvantages of the prior art. The method of manufacturing the semiconductor component is simple and is low cost because the bottom capacitor electrode is formed simultaneously with an interconnect layer of the semiconductor component, the top capacitor electrode is formed simultaneously with another interconnect layer of the component, and the capacitor dielectric layer is formed simultaneously with an interlayer dielectric located between the two interconnect layers. The use of an aluminum nitride layer in the capacitor dielectric layer protects or preserves the interlayer dielectric and all of the underlying semiconductor devices. The semiconductor component is compatible with high current, and high frequency applications.

Although the invention has been described with reference to specific embodiments, it will be understood by those skilled in the art that various changes may be made without departing from the spirit or scope of the invention. For instance, the numerous details set forth herein such as, for example, the compositions and thicknesses of the dielectric and electrically conductive layers are provided to facilitate the understanding of the invention and are not provided to limit the scope of the invention. Furthermore, dielectric layer 130 in FIG. 1 and dielectric layer 470 in FIG. 4 can be modified to be composite dielectric layers similar to layer 250 in FIG. 2. Additionally, interconnect layer 140 in FIG. 1 and interconnect layer 360 in FIG. 4 can each consist of a single metal layer. Moreover, depending upon the desired final structure, additional dielectric and/or metal layers can be disposed between the dielectric and metal layers illustrated in FIGS. 1 through 4. As an example, interconnect layer 360 in FIG. 4 can be an airbridge structure. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a semiconductor component comprising:
   forming a first dielectric layer over a substrate, the first dielectric layer comprised of aluminum;
   forming a second dielectric layer over the first dielectric layer, the second dielectric layer substantially devoid of aluminum;
   forming a first electrically conductive layer over the second dielectric layer;
   etching the first electrically conductive layer;
   after forming the first electrically conductive layer, etching the second dielectric layer to expose at least a portion of the first dielectric layer; and
   forming a third dielectric layer over the substrate, the third dielectric layer located under the first dielectric, wherein etching the second dielectric layer further comprises:
      using the first dielectric layer to prevent the third dielectric layer from being etched.

2. The method of claim 1 wherein:
   forming the third dielectric layer further comprises:
      providing the third dielectric layer substantially devoid of aluminum.

3. The method of claim 1 further comprising:
   forming a second electrically conductive layer over the substrate, the second electrically conductive layer located under the first dielectric layer.

4. The method of claim 3 further comprising:
   forming a third dielectric layer over the second electrically conductive layer, the third dielectric layer located under the first dielectric layer, wherein:
      the first and second electrically conductive layers form capacitor electrodes for a capacitor; and
      the first, second, and third dielectric layers form a capacitor dielectric for the capacitor.

5. The method of claim 4 wherein:
   forming the third dielectric layer further comprises:
      providing the third dielectric layer substantially devoid of aluminum.

6. The method of claim 1 wherein:
   forming the first electrically conductive layer further comprises:
      providing the first electrically conductive layer comprised of titanium.

7. The method of claim 1 further comprising:
   forming a second electrically conductive layer over the substrate, the second electrically conductive layer located under the first dielectric layer and comprised of gold; and
   forming a third dielectric layer over the second electrically conductive layer, the third dielectric layer located under the first dielectric layer and substantially devoid of aluminum.

8. The method of claim 7 wherein:
   forming the first electrically conductive layer further comprises:
      providing the first electrically conductive layer comprised of titanium.

9. The method of claim 7 wherein:
   forming the third dielectric layer further comprises:
      providing the third dielectric layer comprised of a dielectric material; and
   forming the first dielectric layer further comprises:
      providing the first dielectric layer comprised of the dielectric material.

10. The method of claim 1 further comprising:
    forming a plurality of semiconductor devices supported by the substrate.

11. A method of manufacturing a semiconductor component comprising:
    forming a first capacitor electrode over a substrate;
    forming a first capacitor dielectric layer over the first capacitor electrode and comprised of silicon and nitrogen;
    forming a second capacitor dielectric layer over the first capacitor dielectric layer and comprised of aluminum and nitrogen;
    forming a third capacitor dielectric layer over the second capacitor dielectric layer and comprised of silicon and nitrogen; and
    forming a second capacitor electrode over the second capacitor dielectric layer.

12. A method of manufacturing a semiconductor component comprising:
    providing a semiconductor substrate;
    depositing a first dielectric layer over the semiconductor substrate;
    patterning the first dielectric layer;
    after patterning the first dielectric layer, depositing a first metal layer over the first dielectric layer;
    depositing a second metal layer over the first metal layer;
    after depositing the second metal layer, patterning the first and second metal layers;
    after patterning the first and second metal layers, depositing a second dielectric layer over the second metal layer;
    depositing a third dielectric layer over the second dielectric layer;
    depositing a fourth dielectric layer over the third dielectric layer;
    depositing a third metal layer over the fourth dielectric layer;

depositing a fourth metal layer over the third metal layer;

after depositing the fourth metal layer, patterning the third and fourth metal layers; and after patterning the fourth metal layer, patterning the fourth dielectric layer.

13. The method of claim 12 further comprising:

forming a plurality of semiconductor devices supported by the semiconductor substrate; and before depositing the third metal layer, patterning the second dielectric layer to leave a portion of the second dielectric layer over the plurality of semiconductor devices, wherein:
  after patterning the fourth dielectric layer, the portion of the second dielectric layer remains over the plurality of semiconductor devices.

14. The method of claim 13 wherein:

depositing the third dielectric layer further comprises:
  providing the third dielectric layer comprised of aluminum nitride; and patterning the fourth dielectric layer further comprises:
  using the third dielectric layer as an etch stop to protect the second dielectric layer.

15. The method of claim 14 wherein:

depositing the second dielectric layer further comprises:
  providing the second dielectric layer comprised of a dielectric material;

depositing the fourth dielectric layer further comprises:
  providing the fourth dielectric layer comprised of the dielectric material.

16. The method of claim 15 wherein:

depositing the first metal layer further comprises:
  providing the first metal layer comprised of a barrier material;

depositing the second metal layer farther comprises:
  providing the second metal layer comprised of an electrically conductive material have a resistivity lower than a resistivity of the barrier material;

depositing the third metal layer further comprises:
  providing the third metal layer comprised of the barrier material; and depositing the fourth metal layer further comprises:
  providing the fourth metal layer comprised of the electrically conductive material.

17. The method of claim 16 further comprising:

providing the dielectric material comprised of silicon nitride;

providing the barrier material comprised of titanium; and providing the electrically conductive material comprised of gold.

18. The method of claim 17 wherein:

depositing the second metal layer further comprises:
  depositing the second metal layer on the first metal layer;

depositing the second dielectric layer further comprises:
  depositing the second dielectric layer on the second metal layer;

depositing the third dielectric layer further comprises:
  depositing the third dielectric layer on the second dielectric layer;

depositing the fourth dielectric layer further comprises:
  depositing the fourth dielectric layer on the third dielectric layer;

depositing the third metal layer further comprises:
  depositing the third metal layer on the fourth dielectric layer; and depositing the fourth metal layer further comprises:
  depositing the fourth metal layer on the third metal layer.

19. The method of claim 11 further comprising:

etching the third capacitor dielectric layer to expose the second capacitor dielectric layer, wherein the second capacitor dielectric layer is an etch stop layer.

20. The method of claim 11, wherein the first dielectric layer comprises aluminum nitride; the second dielectric layer comprises silicon nitride, and the third dielectric layer comprises silicon nitride.

21. The method of claim 11, wherein the first capacitor dielectric layer is approximately 30 to 50 nanometers in thickness, the second capacitor dielectric layer is approximately 20 to 40 nanometers in thickness, and the third capacitor dielectric layer is approximately 30 to 50 nanometers in thickness.

* * * * *

UNITED STATES PATENT AND TRADEMARK OFFICE
CERTIFICATE OF CORRECTION

PATENT NO. : 6,465,297 B1  Page 1 of 1
DATED : October 15, 2002
INVENTOR(S) : Haldane S. Henry et al.

It is certified that error appears in the above-identified patent and that said Letters Patent is hereby corrected as shown below:

<u>Title page,</u>
Item [54], Title, change "HAVING A CAPICITOR" to -- AND SEMICONDUCTOR COMPONENT THEREOF --.

Signed and Sealed this

Twenty-second Day of November, 2005

JON W. DUDAS
*Director of the United States Patent and Trademark Office*